United States Patent [19]

Wakasugi et al.

[11] Patent Number: 4,891,344

[45] Date of Patent: Jan. 2, 1990

[54] LOW DIELECTRIC CONSTANT CERAMIC SUBSTRATE

[75] Inventors: Yasumasa Wakasugi, Kawasaki; Masahiro Sugimoto, Yokosuka, both of Japan

[73] Assignee: Fujitsu Limited, Kawasaki, Japan

[21] Appl. No.: 943,350

[22] Filed: Dec. 19, 1986

[30] Foreign Application Priority Data

Dec. 20, 1985 [JP] Japan ................................ 60-285772

[51] Int. Cl.$^4$ ............................................. G04B 35/02
[52] U.S. Cl. ................................................. 501/128
[58] Field of Search ............... 501/127, 118, 122, 125, 501/153, 154

[56] References Cited

U.S. PATENT DOCUMENTS

| 4,125,407 | 11/1978 | Ueno | 106/57 |
| 4,460,916 | 7/1984 | Hashimoto et al. | 357/80 |
| 4,624,896 | 11/1986 | Watanabe et al. | 428/428 |
| 4,688,015 | 8/1987 | Kojima et al. | 338/34 |

FOREIGN PATENT DOCUMENTS

| 2131442 | 1/1973 | Fed. Rep. of Germany | 501/127 |
| 2332940 | 1/1974 | Fed. Rep. of Germany | 501/127 |
| 49-96004 | 9/1974 | Japan | 501/127 |
| 54-26565 | 9/1979 | Japan | 501/127 |
| 57-115895 | 7/1982 | Japan . | |
| 58-95643 | 6/1983 | Japan . | |
| 59-217392 | 12/1984 | Japan . | |
| 61-106430 | 5/1986 | Japan | 501/127 |

Primary Examiner—William R. Dixon, Jr.
Assistant Examiner—Susan Hollenbeck
Attorney, Agent, or Firm—Armstrong, Nikaido, Marmelstein, Kubovcik & Murray

[57] ABSTRACT

A low dielectric constant ceramic substrate comprised of 90 to 98% of mullite ($3Al_2O_3 \cdot 2SiO_2$) and 10 to 2% of a sintering promotor comprised of 0.5 to 3% of magnesia (MgO) and 1.5 to 7% of calcium oxide (CaO).

2 Claims, 2 Drawing Sheets

LOW DIELECTRIC CONSTANT CERAMIC SUBSTRATE

BACKGROUND OF THE INVENTION (1) Field of the Invention

The present invention relates to a ceramic plate, more particularly, to a ceramic substrate or a ceramic package carrying a semiconductor element such as an IC and LSI.

(2) Description of the Related Art

Ceramic plates used for carrying semiconductor elements are normally alumina ($Al_2O_3$) sintered plates, which have a superior strength, insulation, and chemical stability; i.e., a ceramic package is produced by using alumina as the raw material, (for example, cf. Tonegawa, Hirao and Takami, "Ceramic Package for LSI's", Denshi Zairyo (Electronic Parts and Materials), Vol. 16, No. 2, February 1977, Kogyo Chosakai, pp. 75–80 and 32, and Kumazawa, Ohno and Nomura, "Trends in Ceramic Packaging" Denshi Zairyo, Vol. 21, No. 8, August 1982, Kogyo Chosakai, pp. 52–57).

Recently, the integration degree and the operating speed of a semiconductor element (e.g., an LSI chip) have increased, and particularly in the case of an increase in the operating speed, preferably a dielectric constant of a ceramic material is as low as possible. A conventional alumina ceramic plate, however, has a relatively high dielectric constant (e) of from about 9 to 10, and since a high frequency signal propagation delay-time is proportional to a square root of the dielectric constant, the alumina ceramic plate has an adverse effect on the high frequency signal propagation speed. Accordingly, there is a need for a ceramic plate having a dielectric constant lower than that of the alumina ceramic plate.

Furthermore, there is a relatively large difference between the thermal expansion coefficients of the alumina ceramic plate and a semiconductor (silicon) chip, and when the size of the semiconductor chip is increased, stress is generated in the chip and in a connecting part between the chip and the ceramic plate, causing problems to arise during operation. Therefore, there is also a need for a ceramic plate having a thermal expansion coefficient closer to that of silicon than that of alumina ceramic plate.

SUMMARY OF THE INVENTION

An object of the present invention is to provide a ceramic plate for carrying a semiconductor element, which plate has a dielectric constant lower than that of a conventional alumina ceramic plate.

Another object of the present invention is to provide a ceramic substrate or package on which an improved semiconductor element (device) can be set.

The above-mentioned and other objects of the present invention are attained by providing a low dielectric constant ceramic plate which is comprised of 90 to 98% (preferably 94 to 96%) of mullite ($3Al_2O_3.2SiO_2$) and 10 to 2% (preferably 6 to 4%) of a sintering promotor comprised of 0.5 to 3% (preferably 1.6 to 2.4%) of magnesia (MgO) and 1.5 to 7% (preferably 2.4 to 3.6%) of calcium oxide (CaO).

A major component of the ceramic plate of the present invention is mullite having a dielectric constant lower than that of alumina. If the amount of the sintering promotor is less than 2%, the ceramic plate has an insufficient (flexural) strength and an increasing porosity. On the other hand, if the amount of the promotor is more than 10%, the ceramic plate has an insufficient (flexural) strength and an increasing dielectric constant.

The combination of magnesia and calcium oxide contributes to the formation of a stable glassy material of a four component system of alumina-silica-magnesiacalcium oxide ($Al_2O_3$-$SiO_2$-MgO-CaO) in a ceramic sintered body, which brings the advantages of a lowering of a sintering temperature and an increase of the strength of a sintered body. If the amount of the calcium oxide is more than 7%, the strength of the sintered body is remarkably decreased. On the other hand, if the amount of the calcium oxide is less than 1.5%, the properties of the sintered body (e.g., sintered density) are not improved.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Mullite ceramic plates according to the present invention were produced as follows.

First, magnesia powder and calcium oxide were mixed in the proportions of 3:4 to form a sintering promotor (flux powder), and 0%, 2%, 4%, 6%, and 10% of the sintering promotor and 100%, 98%, 96%, 94%, and 90% of the mullite powder were then mixed to form five specimen mixtures, respectively.

Then, 100 parts of the resultant mixtures, 11 parts of an organic binder (butyral resin or acryl resin), 3.65 parts of a plasticizing agent (di-n-butyl phthalate), 0.5 parts of a dispersant (polyethylene glycol), and a sufficient amount of a solvent were mixed to form a slurry. Green sheets were then formed from the slurry by a doctor blade method, and after drying, the green sheets were cut into the desired plates.

The green plates were then heated and sintered in a suitable furnace having an atmosphere of a wet mixture gas comprised of hydrogen and nitrogen ($H_2/N_2 = 3/1$). During the heating process, removal of the organic binder was carried out at about 250° C. and the sintering was carried out at 1350° C. In the case of a green plate not containing the sintering promotor, the sintering was carried out at 1410° C.

The thus-obtained mullite ceramic plates had the properties shown in Table 1 and FIGS. 1 to 4.

TABLE 1

| Property | Material Mullite Plate Sintering Promotor (%) | | | | | Alumina Plate |
|---|---|---|---|---|---|---|
| | 0 | 2 | 4 | 6 | 10 | |
| Dieletric Constant (at 1 MHz) | 4.8 | 5.5 | 5.6 | 5.8 | 6.2 | 9 ~ 10 |
| Flexural Strength (kg/cm$^2$) | 1410 | 1930 | 2480 | 2420 | 2140 | 3000 |
| Porosity (%) | 1.1 | 0.1 | 0 | 0 | 0 | 0 |
| Shrinkage Factor | | | | | | |
| (Max.) | (15.6) | (15.1) | (15.6) | (16.3) | (16.7) | 17.4 |
| (%) | 13.9 | 14.9 | 15.3 | 16.2 | 16.5 | |
| (Min.) | (13.0) | (14.6) | (15.1) | (16.0) | (16.2) | |
| Sintering Temperature (°C.) | 1410 | 1350 | 1350 | 1350 | 1350 | 1500 ~ 1600 |
| | Present invention | | | | | |

The properties of a conventional alumina ceramic plate are shown in Table 1 as a comparative example.

Figure 1:
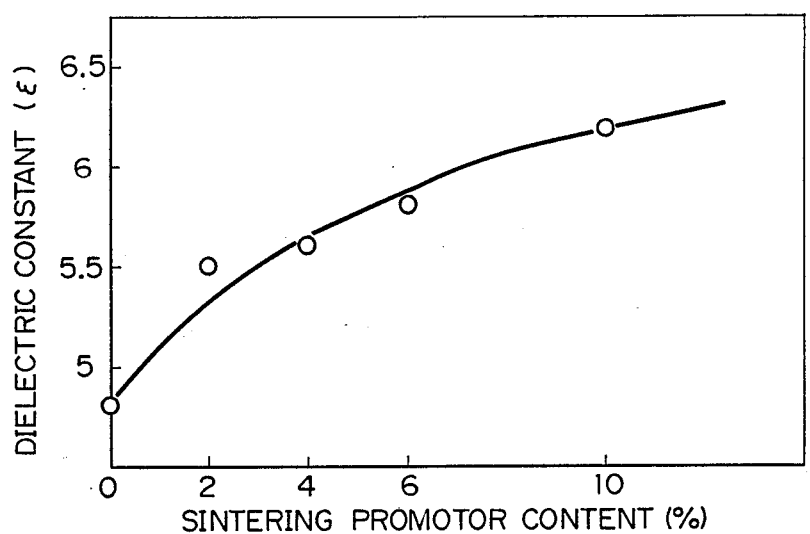
FIG. 1 is a graph showing a relationship between the dielectric constant and sintering promotor content of a mullite ceramic plate.

As is clear from Table 1, the dielectric constant of the mullite ceramic plate according to the present invention is lower than that of the alumina ceramic plate, and accordingly, the mullite ceramic plate can decrease the high frequency signal propagation delaytime, which contributes to an increase of the operating speed of the semiconductor element. As shown in FIG. 1, increasing the content of the sintering promotor (i.e., deceasing the content of the mullite), decreases the dielectric constant.

Figure 2:
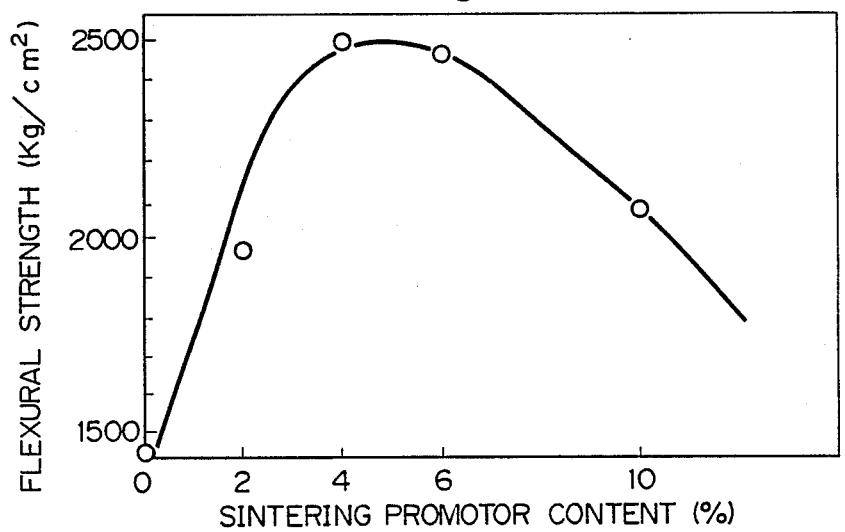
FIG. 2 is a graph showing a relationship between the flexural strength and sintering promotor content of a mullite ceramic plate.

Although the flexural strength of the mullite ceramic plate according to the present invention is lower than that of the alumina ceramic plate, this does not have an adverse effect during usage of a substrate or package. Since preferably the mullite substrate or package has a flexural strength of more than about 2000 kg/cm$^2$, the content of the sintering promotor is from 2% to 10%, as shown in FIG. 2. A content of 4 to 6% of the sintering promotor preferably attains a flexural strength of 2400 to 2500 kg/cm$^2$.

Figure 3:
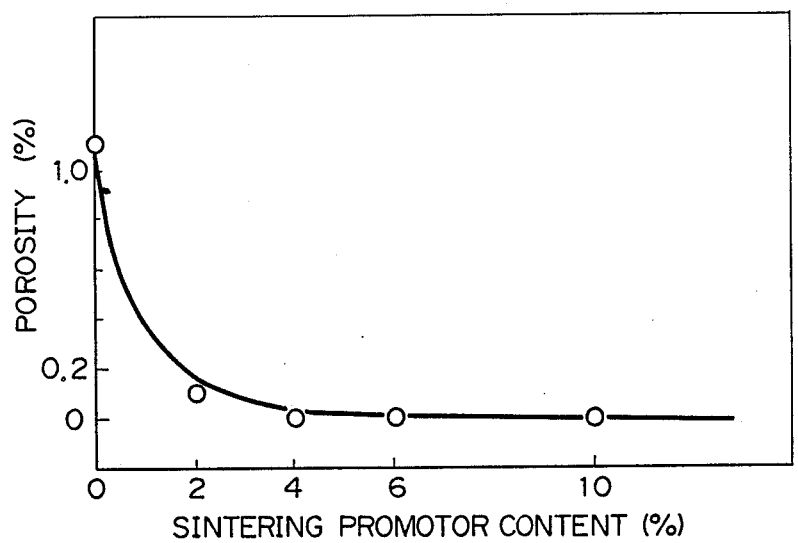
FIG. 3 is a graph showing a relationship between the porosity and sintering promotor content of a mullite ceramic plate.

As shown in FIG. 3, since the porosity is increased by decreasing the content of the sintering promotor, this content is preferably not less than 2%.

Figure 4:
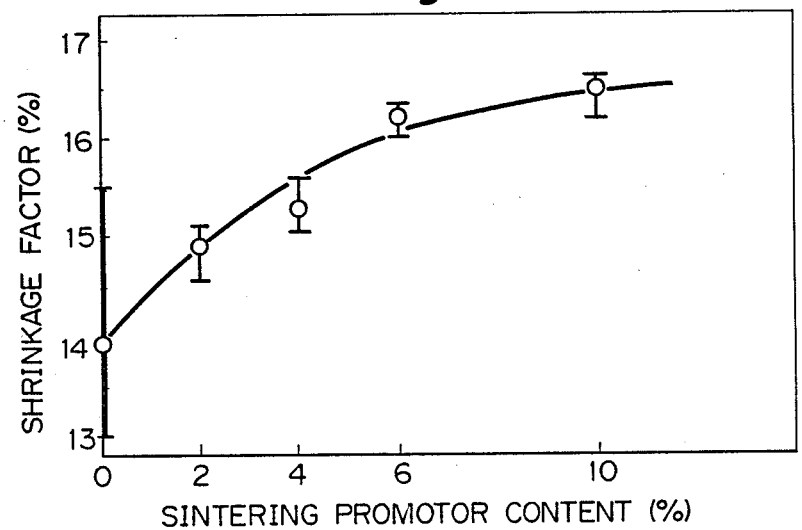
FIG. 4 is a graph showing a relationship between the shrinkage factor and sintering promotor content of a mullite ceramic plate.

As shown in FIG. 4, the shrinkage factor is increased by increasing the sintering promotor. Moreover, the range between the maximum and minimum values of the shrinkage factor of the mullite plates of the present invention is relatively narrow, which contributes to the formation of an accurate pattern in the mullite ceramic substrate or package.

The thermal expansion, linear coefficient of the mullite ceramic plate containing 4% of the sintering promotor was $4-5 \times 10^{-6}$° C., which was smaller than that ($6-7 \times 10^{-6}$° C.) of the alumina ceramic plate. This thermal expansion coefficient of the mullite plate is closer to that ($3.5-4 \times 10^{-6}$° C.) of silicon than that of the alumina ceramic plate, and accordingly, since the difference of the thermal expansion coefficient between the mullite ceramic plate and the silicon chip is smaller than that of the alumina ceramic plate, the generated stress is smaller than in the case of the alumina ceramic plate, and thus a larger sized silicon chip (semiconductor element) can be set on the mullite plate.

The mullite ceramic plate has an advantage in that the sintering temperature thereof is lower than that of the alumina ceramic plate.

It will be obvious that the present invention is not restricted to the above-mentioned embodiments and that many variations are possible for persons skilled in the art without departing from the scope of the invention.

We claim:

1. A low dielectric constant mullite ceramic substrate for carrying semiconductor elements comprised of 90 to 98% of mullite and 10 to 2% of a sintering promotor, which promoter is comprised of 0.5 to 3% of magnesia and 1.5 to 7% of calcium oxide said substrate having a flexural strength of more than 1900kg/cm2 and a dielectric constant of less than 6.5.

2. A ceramic plate according to claim 1, comprised of 94 to 96% of said mullite and 6 to 4% of said sintering promotor, which promotor is comprised of 1.6 to 2.4% of magnesia and 2.4 to 3.6% of calcium oxide.

* * * * *